(12) United States Patent
Lin et al.

(10) Patent No.: US 9,508,830 B2
(45) Date of Patent: Nov. 29, 2016

(54) METHOD OF FORMING FINFET

(71) Applicant: Taiwan Semiconductor Manufacturing Company Limited, Hsinchu (TW)

(72) Inventors: Jr-Jung Lin, Hsinchu (TW); Chih-Han Lin, Hsinchu (TW); Ming-Ching Chang, Hsinchu (TW); Chao-Cheng Chen, Shin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 143 days.

(21) Appl. No.: 14/161,730

(22) Filed: Jan. 23, 2014

(65) Prior Publication Data

US 2015/0206952 A1    Jul. 23, 2015

(51) Int. Cl.
*H01L 29/66* (2006.01)

(52) U.S. Cl.
CPC .............................. *H01L 29/66795* (2013.01)

(58) Field of Classification Search
CPC ................. H01L 29/66181; H01L 29/66553; H01L 21/853431; H01L 29/6681
See application file for complete search history.

(56) References Cited

U.S. PATENT DOCUMENTS

| 7,183,152 | B1 * | 2/2007 | Dakshina-Murthy ... H01L 21/84 257/E21.703 |
|---|---|---|---|
| 2005/0019993 | A1 * | 1/2005 | Lee .......................... H01L 21/84 438/157 |
| 2005/0051825 | A1 * | 3/2005 | Fujiwara ............ H01L 29/41733 257/308 |
| 2006/0214244 | A1 * | 9/2006 | Minakata .......... H01L 21/31122 257/410 |
| 2013/0082308 | A1 * | 4/2013 | Cheng ................. H01L 29/7834 257/288 |
| 2014/0197370 | A1 * | 7/2014 | Leobandung ..... H01L 29/66439 257/9 |

* cited by examiner

*Primary Examiner* — Lex Malsawma
(74) *Attorney, Agent, or Firm* — Jones Day

(57) ABSTRACT

A method of forming a FinFET is provided. A gate oxide layer and a dummy poly layer are substantially simultaneously etched using an etchant having a higher selectivity on the gate oxide layer than on the dummy poly layer. The gate oxide layer and the dummy poly layer are intersected with the gate oxide layer over a fin layer of the FinFET.

23 Claims, 6 Drawing Sheets

METHOD OF FORMING FINFET

FIELD

The technology described in this patent document relates generally to a method of forming a semiconductor structure, and more particularly, a method of forming a field-effect transistor (FinFET).

BACKGROUND

In a FinFET process, a gate oxide layer is disposed between a fin layer and a dummy poly layer, and a spacer is formed above and perpendicular to the gate oxide layer. However, in a succeeding process that etches the gate oxide, a leakage path to an epitaxy layer formed beside the fin layer may be introduced under the spacer. As a result, electron movement of a gate formed within the gate profile may be harmed by the leakage path.

DETAILED DESCRIPTION

Figure 1:
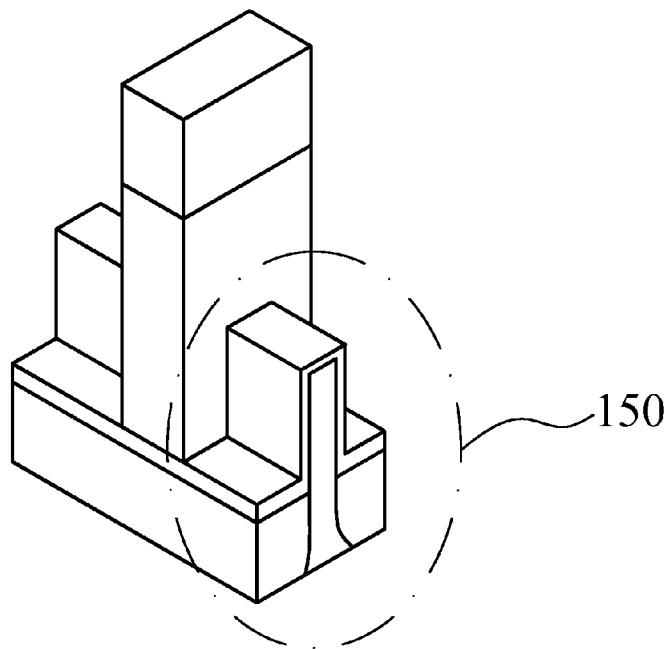
FIG. 1 illustrates a perspective view of a FinFET.
Figure 2:
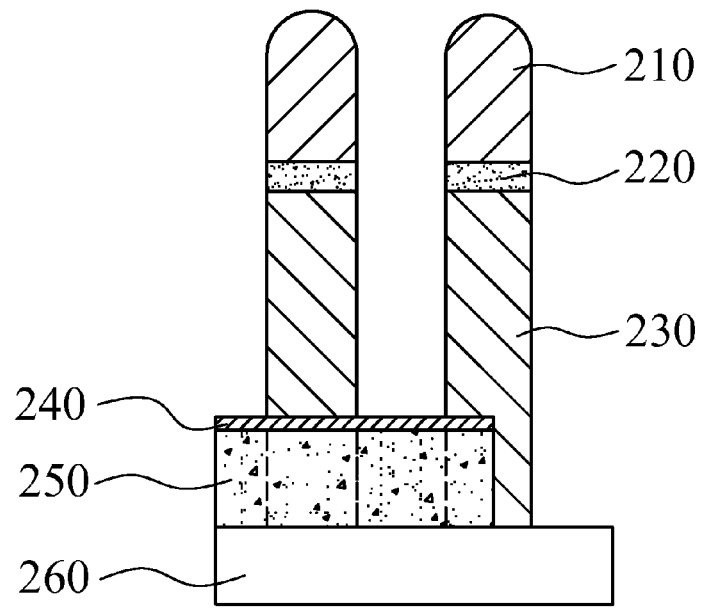
FIGS. 2-3 illustrate various cross-sectional views of a fin structure of FIG. 1 during formation of the fin structure.
Figure 3:
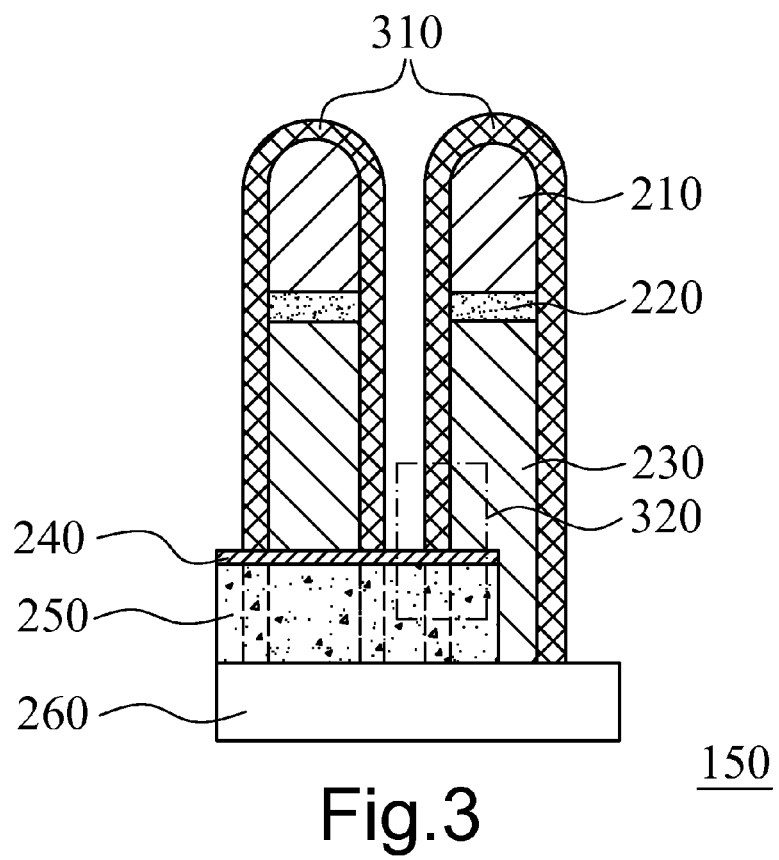

FIG. 1 illustrates a perspective view of a FinFET 100. The FinFET 100 includes a fin structure 150. FIGS. 2-3 illustrate various cross-sectional views of the fin structure 150 during formation of the fin structure 150.

In FIG. 2, the fin structure 150 includes a substrate 260, a fin layer 250, a gate oxide layer 240, a dummy poly layer 230, a first hard mask layer 210, and a second hard mask layer 220. The substrate 260 is below the fin layer 250 and the dummy poly layer 230. A portion of the dummy poly layer 230 is hidden behind the fin layer 250 and the gate oxide layer 240. The fin layer 250 is below the gate oxide layer 240. The dummy poly layer 230 is below the second hard mask 220. The second hard mask 220 is below the first hard mask 210.

In FIG. 3, a spacer layer 310 is disposed for covering the first hard mask 210, the second hard mask 220, and the dummy poly layer 230. A dotted-line surrounded region 320 is additionally marked in FIG. 3, and will be described in greater detail in FIGS. 4-6.

Figure 4:
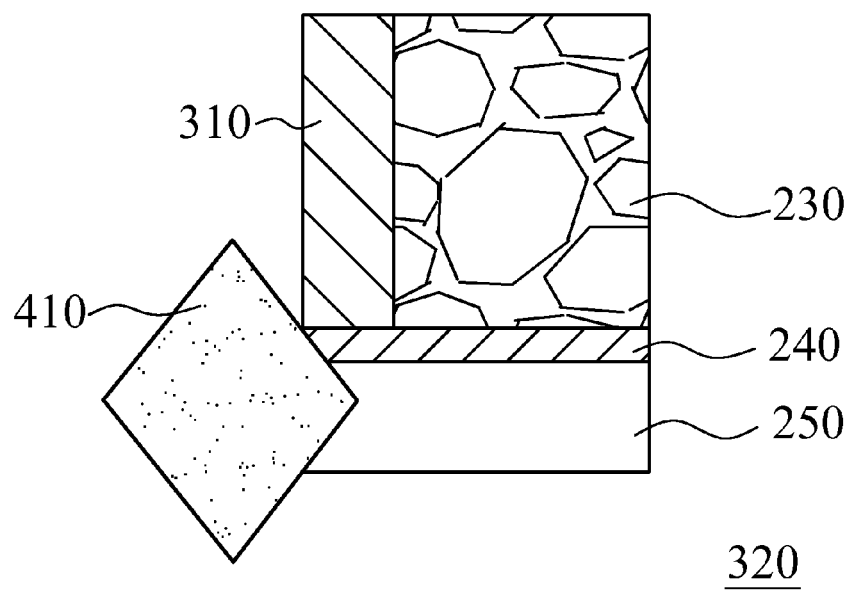
FIGS. 4-6 illustrate various cross-sectional views of a dotted-line surrounded region during formation of the fin structure of FIG. 1.
Figure 5:
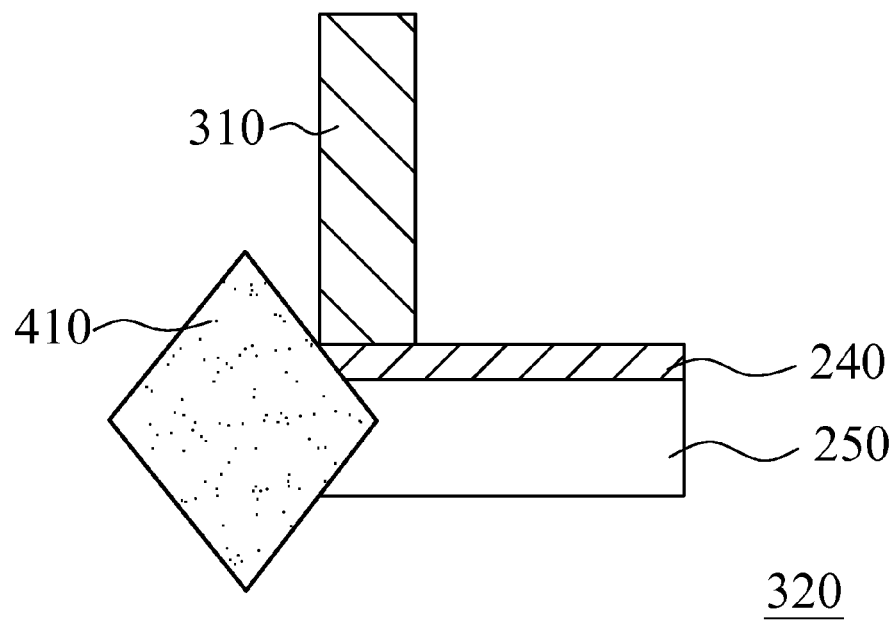
Figure 6:
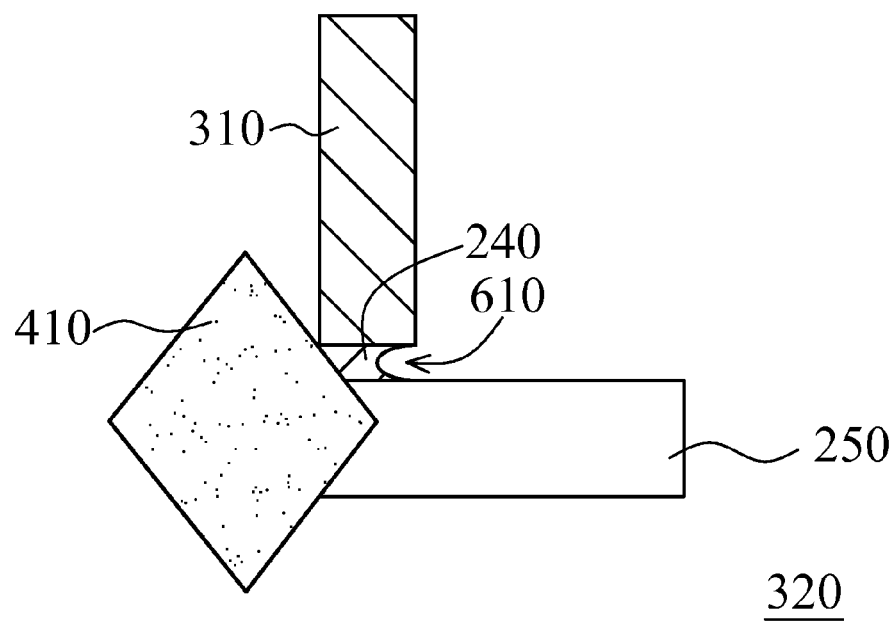

FIGS. 4-6 illustrate various cross-sectional views of the dotted-line surrounded region 320 during formation of the fin structure 150. In FIG. 4, an epitaxy layer 410 is formed beside the fin layer 250 and the gate oxide layer 240. The gate oxide layer 240 is at least partially below the spacer layer 310 and the dummy poly layer 230.

In FIG. 5, the dummy poly layer 230 is removed without more than insignificant etching of the gate oxide layer 240. An etchant used for removing the dummy poly layer 230 has a higher selectivity on the dummy poly layer 230 than that on the gate oxide layer 240.

In FIG. 6, the portion of the gate oxide layer 240 previously below the dummy poly layer 230 is removed by etching.

However, part of the gate oxide layer 240 covered by the spacer layer 310 may also be removed to form a cavity 610 beneath the spacer layer 310. In a succeeding gate depositing process, metal gate materials will be deposited into the cavity 610. Therefore, a leakage path will be formed within the cavity 610 that is currently filled by the metal gate materials. The leakage path may significantly affect electron and hole movement within the metal gate materials and operation accuracy of the fin structure 150.

Figure 7:
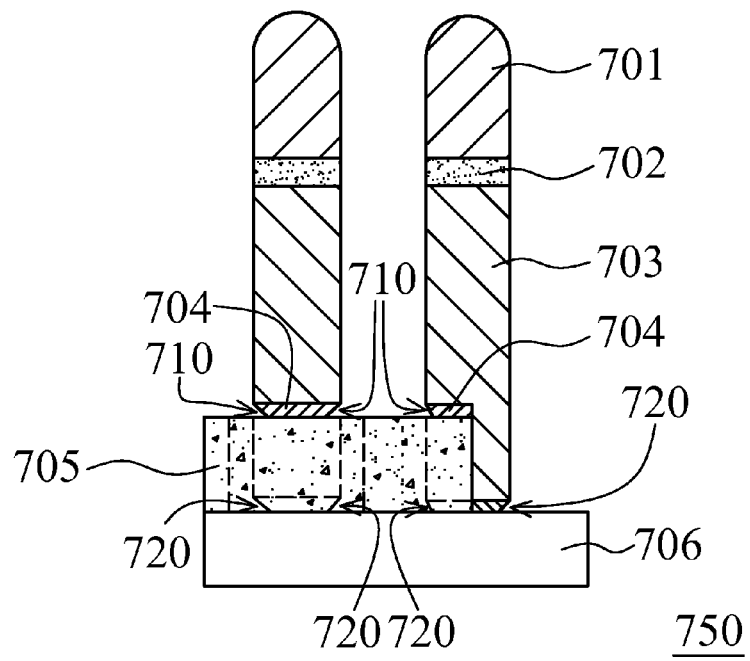
FIGS. 7-8 illustrate various cross-sectional views a fin structure according to a first embodiment.
Figure 8:
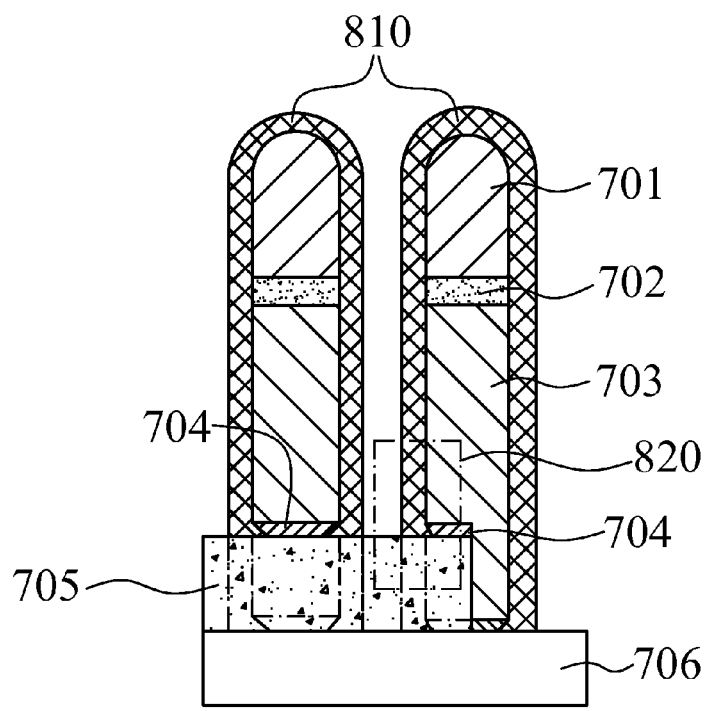

FIGS. 7-8 illustrate various cross-sectional views a fin structure 750 according to a first embodiment.

In FIG. 7, the fin structure 750 includes a substrate 706, a fin layer 705, a gate oxide layer 704, a dummy poly layer 703, a first hard mask layer 701, and a second hard mask layer 702. The dummy poly layer 703 is de-footed by simultaneously etching the gate oxide layer 704 and the dummy poly layer 703 intersected with the gate oxide layer 704 over the fin layer 705.

An etchant having a higher selectivity on the gate oxide layer 704 than that on the dummy poly layer 703 is used for de-footing the dummy poly layer 703. Therefore, the gate oxide layer 704 is significantly etched to render the fin layer 705 to be partially revealed. The dummy poly layer 703 is slightly etched.

With the aid of the etchant, the gate oxide layer 704 and the dummy poly layer 703 are substantially simultaneously etched to form a plurality of cavities 710 below the dummy poly layer 703. The plurality of cavities 710 are located at the intersection of the gate oxide layer 704 and the dummy poly layer 703. Additionally, a plurality of cavities 720 are formed at the bottom of the dummy poly layer 703.

Before the plurality of cavities 710 are formed, the dummy poly layer 703 have foot structures (i.e. orthogonal intersections of the dummy poly layer 703) at the intersection of the gate oxide layer 704 and the dummy poly layer 703. After using the etchant, the foot structures of the dummy poly layer 703 are de-footed to form the plurality of cavities 710.

The dummy poly layer 703 may be de-footed via a wet etching process or a dry etching process.

In a first example, the etchant may include a gas mixture of $Cl_2$ gas and $BCl_3$ gas. A density of the $Cl_2$ gas is lower than a density of the $BCl_3$ gas in the gas mixture, since the $BCl_3$ gas has a higher selectivity in etching the gate oxide layer 704 than in etching the dummy poly layer 703. Furthermore, in another example, a density ratio of the $Cl_2$ gas to the $BCl_3$ gas in the gas mixture may be 1:10.

In a second example, the etchant may include a gas mixture of $Cl_2$ gas and $CF_4$ gas. A density of the $Cl_2$ gas is lower than a density of the $CF_4$ gas in the gas mixture, since the $CF_4$ gas has a higher selectivity in etching the gate oxide layer 704 than in etching the dummy poly layer 703. Furthermore, in another example, a density ratio of the $Cl_2$ gas to the $CF_4$ gas in the gas mixture may be 1:10.

In FIG. 8, a spacer layer 810 is formed for covering the first hard mask 701, the second hard mask 702, and the dummy poly layer 703. While forming the spacer layer 810, the cavities 710 are filled by the spacer layer 810.

Figure 9:
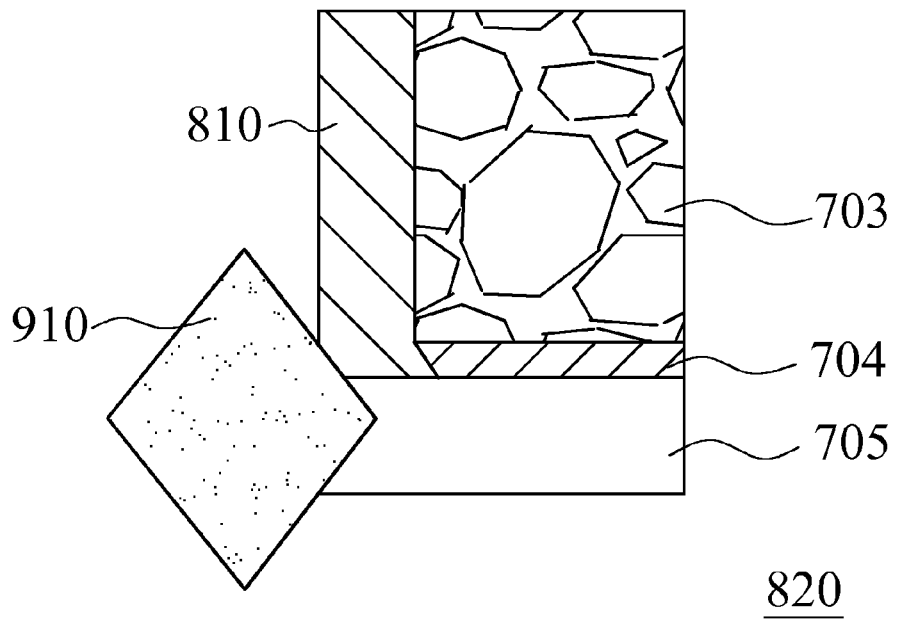
FIGS. 9-11 illustrate various cross-sectional views of the fin structure of FIGS. 7-8 according to the first embodiment.
Figure 10:
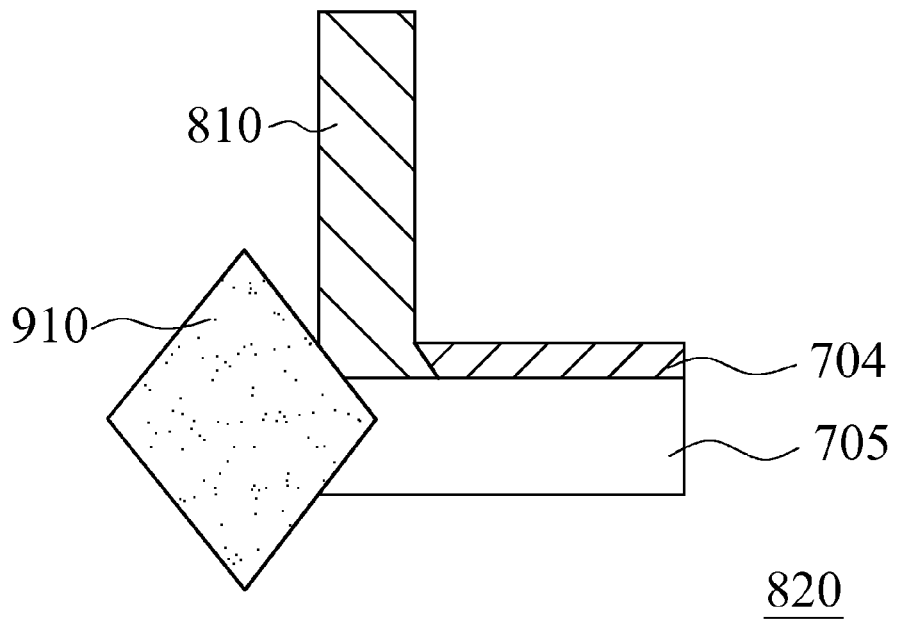
Figure 11:
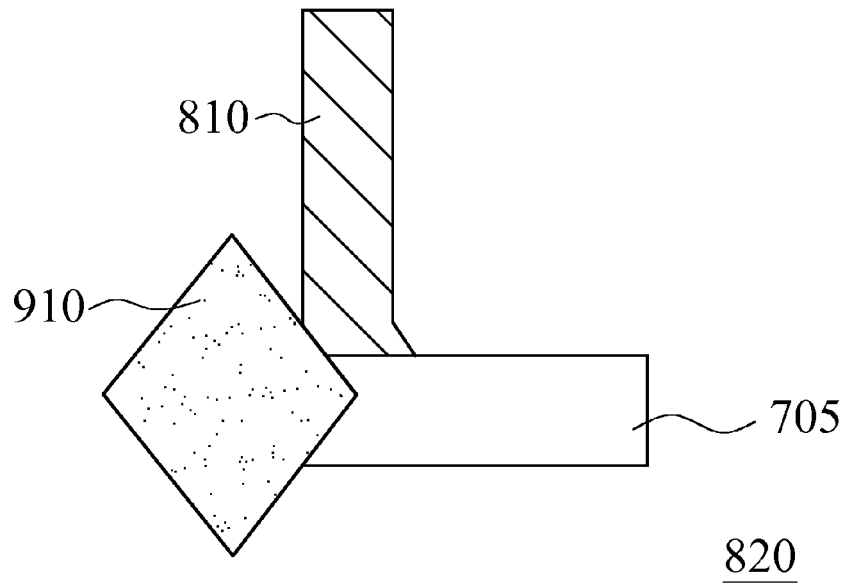

A dotted-line surrounded region 820 is additionally marked in FIG. 8, and will be described in greater detail in FIGS. 9-11. FIGS. 9-11 illustrate various cross-sectional views of the fin structure of FIGS. 7-8 according to the first embodiment.

In FIG. 9, an epitaxy layer 910 is formed on a lateral side of the fin layer 705. The epitaxy layer 910 is partially covered by the spacer layer 810.

In FIGS. 10 and 11, the dummy poly layer 703 and the gate oxide layer 704 are substantially removed in turn. In an example, the dummy poly layer 703 and the gate oxide layer 704 may be substantially removed in turn using a same etchant in a same etching process. The etching process may be a wet etching process or a dry etching process.

After substantially removing the dummy poly layer 703 and the gate oxide layer 704, since a bottom space between the spacer layer 810 and the fin layer 705 has been covered, the leakage path previously caused by the gate oxide layer 240 is substantially removed. Therefore, after the succeeding gate depositing process is completed, electron and hole movement within the metal gate materials and the operation accuracy of the fin structure 750 can be alleviated from being affected by the leakage path.

Figure 12:
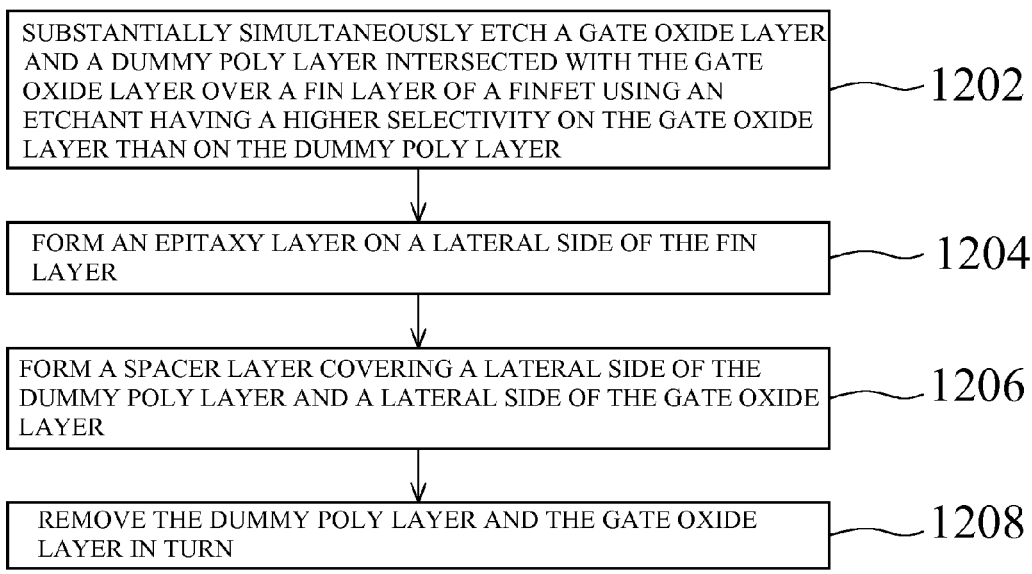
FIG. 12 illustrates a flowchart of the method of forming a FinFET.

FIG. 12 illustrates a flowchart of the method of forming a FinFET. The method includes the following stages: Substantially simultaneously etch a gate oxide layer and a dummy poly layer intersected with the gate oxide layer over a fin layer of a FinFET using an etchant having a higher selectivity on the gate oxide layer than on the dummy poly layer (1202). Form an epitaxy layer on a lateral side of the fin layer (1204). Form a spacer layer covering a lateral side of the dummy poly layer and a lateral side of the gate oxide layer (1206). Remove the dummy poly layer and the gate oxide layer in turn (1208).

This disclosure teaches a method of forming a FinFET. In one embodiment, a gate oxide layer and a dummy poly layer are substantially simultaneously etched using an etchant having a higher selectivity on the gate oxide layer than on the dummy poly layer. The gate oxide layer and the dummy poly layer are intersected with the gate oxide layer over a fin layer of the FinFET.

This disclosure teaches a FinFET. In one embodiment, the FinFET includes a substrate, a fin layer, a gate oxide layer, and a dummy poly layer. The substrate is below the fin layer and the dummy poly layer. The fin layer is below the gate oxide layer. The dummy poly layer is intersected with the gate oxide layer over the fin layer. A portion of the dummy poly layer is hidden behind the fin layer and the gate oxide layer. The dummy poly layer is de-footed by simultaneously etching the gate oxide layer and the dummy poly layer using an etchant having a higher selectivity on the gate oxide layer than on the dummy poly layer.

This disclosure further teaches a method of forming a FinFET. In one embodiment, a gate oxide layer and a dummy poly layer intersected with the gate oxide layer over a fin layer of the FinFET are substantially simultaneously etched using an etchant having a higher selectivity on the gate oxide layer than on the dummy poly layer. A spacer layer covering a lateral side of the dummy poly layer and a lateral side of the gate oxide layer is formed after substantially simultaneously etching the gate oxide layer and the dummy poly layer using the etchant. The dummy poly layer and the gate oxide layer are removed in turn.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A method of forming a fin field-effect transistor (FinFET), the method comprising:
    substantially simultaneously etching a gate oxide layer and a dummy poly layer intersected with the gate oxide layer over a fin layer of the FinFET using an etchant having a higher selectivity on the gate oxide layer than on the dummy poly layer, wherein the etching of the gate oxide layer and the dummy poly layer forms a cavity in the gate oxide layer that is below the dummy poly layer; and
    forming a spacer layer covering a lateral side of the dummy poly layer and a lateral side of the gate oxide layer, the spacer layer filling the cavity in the gate oxide layer.

2. The method of claim 1, wherein substantially simultaneously etching the gate oxide layer and the dummy poly layer using the etchant comprises:
substantially simultaneously etching the gate oxide layer and the dummy poly layer using the etchant under a wet etching process.

3. The method of claim 1, wherein substantially simultaneously etching the gate oxide layer and the dummy poly layer using the etchant comprises:
substantially simultaneously etching the gate oxide layer and the dummy poly layer using the etchant under a dry etching process.

4. The method of claim 1, wherein the etchant includes a gas mixture of $Cl_2$ gas and a $BCl_3$ gas, and a density of the $Cl_2$ gas is lower than a density of the $BCl_3$ gas in the gas mixture.

5. The method of claim 1, wherein a density ratio of the $Cl_2$ gas to the $BCl_3$ gas in the gas mixture is 1:10.

6. The method of claim 5, wherein a density ratio of the $Cl_2$ gas to the $CF_4$ gas in the gas mixture is 1:10.

7. The method of claim 1, wherein the etchant includes a gas mixture of $Cl_2$ gas and a $CF_4$ gas, and a density of the $Cl_2$ gas is lower than a density of the $CF_4$ gas in the gas mixture.

8. The method of claim 1, further comprising:
forming a spacer layer covering a lateral side of the dummy poly layer and a lateral side of the gate oxide layer after substantially simultaneously etching the gate oxide layer and the dummy poly layer using the etchant; and
removing the dummy poly layer and the gate oxide layer in turn.

9. The method of claim 8, further comprising:
forming an epitaxy layer on a lateral side of the fin layer before forming the spacer layer, wherein the spacer layer partially covers the epitaxy layer.

10. The method of claim 8, wherein removing the gate oxide layer and the dummy poly layer in turn comprises:
removing the gate oxide layer and the dummy poly layer in turn under a wet etching process.

11. The method of claim 8, wherein removing the gate oxide layer and the dummy poly layer in turn comprises:
removing the gate oxide layer and the dummy poly layer in turn under a dry etching process.

12. The method of claim 1, wherein the etching of the gate oxide layer and the dummy poly layer comprises a lateral etch of the gate oxide layer that undercuts the dummy poly layer.

13. A method of forming a FinFET, comprising:
substantially simultaneously etching a gate oxide layer and a dummy poly layer intersected with the gate oxide layer over a fin layer of the FinFET using an etchant having a higher selectivity on the gate oxide layer than on the dummy poly layer, wherein the etching of the gate oxide layer and the dummy poly layer forms a cavity in the gate oxide layer that is below the dummy poly layer; and
forming a spacer layer covering a lateral side of the dummy poly layer and a lateral side of the gate oxide layer after substantially simultaneously etching the gate oxide layer and the dummy poly layer using the etchant, the spacer layer filling the cavity in the gate oxide layer; and
removing the dummy poly layer and the gate oxide layer in turn.

14. The method of claim 13, further comprising:
forming an epitaxy layer on a lateral side of the fin layer before forming the spacer layer, wherein the spacer layer partially covers the epitaxy layer.

15. The method of claim 13, wherein substantially simultaneously etching the gate oxide layer and the dummy poly layer using the etchant comprises:
substantially simultaneously etching the gate oxide layer and the dummy poly layer using the etchant under a wet etching process.

16. The method of claim 13, wherein substantially simultaneously etching the gate oxide layer and the dummy poly layer using the etchant comprises:
substantially simultaneously etching the gate oxide layer and the dummy poly layer using the etchant under a dry etching process.

17. The method of claim 13, wherein the etching of the gate oxide layer and the dummy poly layer comprises a lateral etch of the gate oxide layer that undercuts the dummy poly layer.

18. A method of forming a fin field-effect transistor (FinFET), the method comprising:
substantially simultaneously etching a gate oxide layer and a dummy poly layer intersected with the gate oxide layer over a fin layer of the FinFET using an etchant having a higher selectivity on the gate oxide layer than on the dummy poly layer, wherein the etching removes a foot structure of the dummy poly layer and forms a cavity in the gate oxide layer that is below the dummy poly layer;
forming a spacer layer covering a lateral side of the dummy poly layer and a lateral side of the gate oxide layer after substantially simultaneously etching the gate oxide layer and the dummy poly layer using the etchant, the spacer layer filling the cavity in the gate oxide layer; and
removing the dummy poly layer and the gate oxide layer in turn.

19. The method of claim 18, wherein substantially simultaneously etching the gate oxide layer and the dummy poly layer using the etchant comprises:
substantially simultaneously etching the gate oxide layer and the dummy poly layer using the etchant under a wet etching process.

20. The method of claim 18, wherein substantially simultaneously etching the gate oxide layer and the dummy poly layer using the etchant comprises:
substantially simultaneously etching the gate oxide layer and the dummy poly layer using the etchant under a dry etching process.

21. The method of claim 18, wherein the etchant includes a gas mixture of $Cl_2$ gas and a $BCl_3$ gas, and a density of the $Cl_2$ gas is lower than a density of the $BCl_3$ gas in the gas mixture.

22. The method of claim 18, wherein a density ratio of the $Cl_2$ gas to the $BCl_3$ gas in the gas mixture is 1:10.

23. The method of claim 18, wherein the etching of the gate oxide layer and the dummy poly layer comprises a lateral etch of the gate oxide layer that undercuts the dummy poly layer.

* * * * *